United States Patent [19]
Sung

[11] Patent Number: 6,150,858
[45] Date of Patent: Nov. 21, 2000

[54] PHASE COMPENSATION CIRCUIT OF DIGITAL PROCESSING PLL

[75] Inventor: Won Sik Sung, Anyang-Si, Rep. of Korea

[73] Assignee: LG Information & Communications, Ltd., Rep. of Korea

[21] Appl. No.: 09/218,772

[22] Filed: Dec. 22, 1998

[30] Foreign Application Priority Data

Dec. 29, 1997 [KR] Rep. of Korea .................. 97-42821 U

[51] Int. Cl.[7] ...................................................... H03L 7/06
[52] U.S. Cl. ............................................ 327/156; 375/376
[58] Field of Search ..................................... 327/144–148, 327/150, 151, 155–157, 159, 160, 162, 163; 331/17; 375/373–376

[56] References Cited

U.S. PATENT DOCUMENTS 5,673,004  9/1997  Park ........................................ 331/1 A
5,696,468  12/1997  Nise .......................................... 331/14
5,917,873  6/1999  Shiomoto et al. ...................... 375/376
5,920,214  7/1999  Lee et al. ................................ 327/147
5,986,485  11/1999  O'Sullivan .............................. 327/156

*Primary Examiner*—My-Trang Nu Ton
*Attorney, Agent, or Firm*—Long Aldridge & Norman

[57] ABSTRACT

The present invention is to provide a phase compensation circuit of a DPPLL capable of hitless switching during switching the system clock, by exact matching frequency and phase of the DPPLL about phase difference which is less than minimum differential phase which may be detectable the way of digital and by distinguishing phase difference about the other party clock such that each clock unit commonly has the clock generated from the pair of clock units, alternatively and by switching the system clock in case that there is no difference after distinguishing, in the clock supplying system using the pair of lock units which have the phases that is asynchronized to the reference clock.

11 Claims, 6 Drawing Sheets

PHASE COMPENSATION CIRCUIT OF DIGITAL PROCESSING PLL

BACKGROUND

Technical Field

The present invention relates in general to a system clock supplying circuit, particularly, to a phase compensation circuit of a digital processing phase-locked loop(hereinafter, referred to DPPLL) capable of hitless switching such that a phase is not changed during switching a system clock, by matching the phase perfectly as well as frequency compensation in the DPPLL.

Additionally, the present invention relates to the phase compensation circuit of the DPPLL capable of hitless switching by matching the phase perfectly as well as frequency compensation generated from a pair of clock units in a clock supplying system in case that a phase is changed because a reference clock inputted to each clock unit includes jitter or in case that there is no input reference clock, in which the clock supplying system consists of main and reserved units for supplying the clock by duplicating the pair of clock units respectively.

Background

FIG. 1 shows a block diagram indicating a conventional DPPLL structure. The DPPLL comprises a divider 11 for dividing a system clock with a predetermined dividing rate and feedbacking the system clock, a phase comparator 12 for calculating a phase difference by comparing phases of the system clock divided from the divider 11 with the reference clock and outputting the phase difference by use of the pulse width, a phase difference counter 13 for counting an output of the phase comparator 12 with the system clock, a microprocessor(digital filter) 14 for averaging the differential phases difference by receiving counted results from the counter 13, a D/A converter 15 for converting the average from the microprocessor 14 to a corresponding analog amplitude signal, and a voltage controlled crystal oscillator (hereinafter, referred to VCXO) 16 for oscillating a frequency clock in accordance with the analog amplitude signal. Here, the phase comparator 12 consists of an invertor and an AND gate.

Now the conventional DPPLL above will be explained.

First, the divider 11 divides the system clock oscillated from the VCXO 16 by a predetermined dividing rate and applies the system clock to the phase comparator 12.

And the phase comparator 12 inverts the clock via the divider 11 in the inverter and applies to the AND gate, and the AND gate and-operates the inverted signal and the reference clock. Thereby, the comparator 12 compares the phase of the system clock divided through the divider 11 with the phase of the reference clock, calculates the phase difference, modulates the phase difference by use of pulse width and outputs the pulse width.

Accordingly, the phase difference counter 13 counts the phase difference pulse applied from the phase comparator 12 by using an express system clock feedbacked from the VCXO 16, and applies the count value(N) to the microprocessor(digital filter) 14.

And then, the microprocessor 14 receives several count values as much as the phase difference applied from the counter 13, successively, averages the counter values and outputs the average values to the D/A converter 15. And the D/A converter 15 converts the average values from the microprocessor 14 to a corresponding analog amplitude value, and applies the analog value to the VCXO 16.

In addition, the VCXO 16 oscillates a clock of frequency in accordance with the analog amplitude value applied from the converter 15, and later system clock repeats like above operation. Consequently, frequency becomes quicker or slower according to the reference clock, so it is capable of acquiring the system clock of which frequency is compensated gradually.

Accordingly, it prevents jitter or phase hit because frequency is stable in the DPPLL. Here the jitter and the phase hit are generated when frequency changes suddenly.

However, because the DPPLL is accomplished with a digital count way for detecting by counting the phase difference pulse amplitude value by use of the system clock, minimum count value of the digital counter is 1. Therefore, the DPPLL may compensate a phase difference pulse amplitude only, in which the phase difference pulse amplitude corresponds to one cycle of the system clock(the digital count value is 1) or more than one cycle of the system clock(the digital count value is over 1). There is a disadvantage that it is impossible to compensate frequency about the phase difference pulse amplitude corresponding to less than one cycle of the system clock(the digital count value is 0).

For example, in case that a system clock has frequency, 10 MHz, the count value may be outputted from the counter 13 as over 1 when the phase difference pulse amplitude from the comparator 12 is over about 100 ns. In other words, it is difficult to sense when the phase difference is under 100 ns.

Besides, when the frequency is compensated like above, it is not a big problem to synchronize a synchronous digital hierarchy(hereinafter, referred to SDH) communications N/W. But, most of SDH apparatus are duplicated by a pair of clock units as one by one, and the pair of clock units are accomplished with the above DPPLL and also senses the phase difference by the same way.

And the same reference clock is supplied to the pair of clock units at the same time respectively, in the one by one duplication structure.

Because the pair of clock units have the different oscillating time(even though the frequencies are synchronized in the clock units), the phases are different from each other in one cycle of the system clock. In other words, the system clock phases of the pair of clock units may be have 180 degree difference, or 90 to 270.

For this reason, there are drawbacks that normal data may changed by the phase change of the system clock during switching the clock units.

SUMMARY

Accordingly, the present invention is provided to solve the problems. A first object of the present invention is to provide a phase compensation circuit of a DPPLL capable of hitless switching during switching the system clock, by exact matching frequency and phase of the DPPLL about phase difference which is less than minimum phase difference which may be detectable the way of digital(phase difference having less than one cycle of the system clock), in which the DPPLL is established in order to compensate by detecting the phase difference of the system clock and the reference clock by the digital way.

A second object of the present invention is to provide a phase compensation circuit of a DPPLL capable of hitless switching, by distinguishing phase difference about the other party clock such that each clock unit commonly has the clock generated from the pair of clock units, alternatively and by switching the system clock in case that there is no difference after distinguishing, in the clock supplying system using the pair of clock units which have the phases that is asynchronized to the reference clock.

One embodiment of the present invention to achieve the first object provides a digital processing phase-locked loop (DPPLL), comprising a first detecting path of detecting a differential phase value of a pulse outputted from phase comparating means, by use of a digital value, a second detecting path of detecting the differential phase value of the pulse by use of an analog value, control means for comparing the digital differential phase value with a system clock value and selecting and outputting the analog differential phase value in case that the digital differential phase value is smaller than a specific range of the system clock value, and voltage controlled oscillating means for outputting a phase compensated system clock by using the outputted signal.

The other embodiment of the present invention to achieve the second object provides a digital processing phase-locked loop(DPPLL), comprising a first detecting path of detecting a differential phase value of a pulse outputted from phase comparating means, by use of a digital value, a second detecting path of detecting the differential phase value of the pulse by use of an analog value, control means for comparing the digital differential phase value with a system clock value and selecting and outputting the analog differential phase value in case that the digital differential phase value is smaller than a specific range of the system clock value, voltage controlled oscillating means for outputting a phase compensated system clock by using the outputted signal, and phase switching means for switching a system clock in a corresponding area by detecting an area where the differential phase is smaller than a specific range of the system clock value, after comparing the phase of the clock with clock from the other unit. Other technical advantages are readily apparent to one skilled in the art from the following figures, descriptions, and claims.

BRIEF DESCRIPTION

Other objects, features and advantages of the present invention will become more apparent from the following detailed description when read in conjunction with the accompanying drawings, in which:

FIG. 1 is a block diagram indicating a structure of a conventional DPPLL,

FIG. 2 is a block diagram of a phase compensation circuit of a DPPLL according to a first embodiment of the present invention, FIG. 3 is an operational timing flowchart of each part of FIG. 2, FIG. 4 is a block diagram indicating a phase compensation circuit of a DPPLL for hitless switching according to a second embodiment of the present invention, FIG. 5 is in detail a circuit diagram of a phase difference comparator of FIG. 4, and FIG. 6 is an operational timing flowchart of each part of FIG. 5.

DETAILED DESCRIPTION OF THE PREFERRED EMBODIMENTS

Embodiments of the invention will be described with reference to FIGS. 2 to 6.

Figure 2:
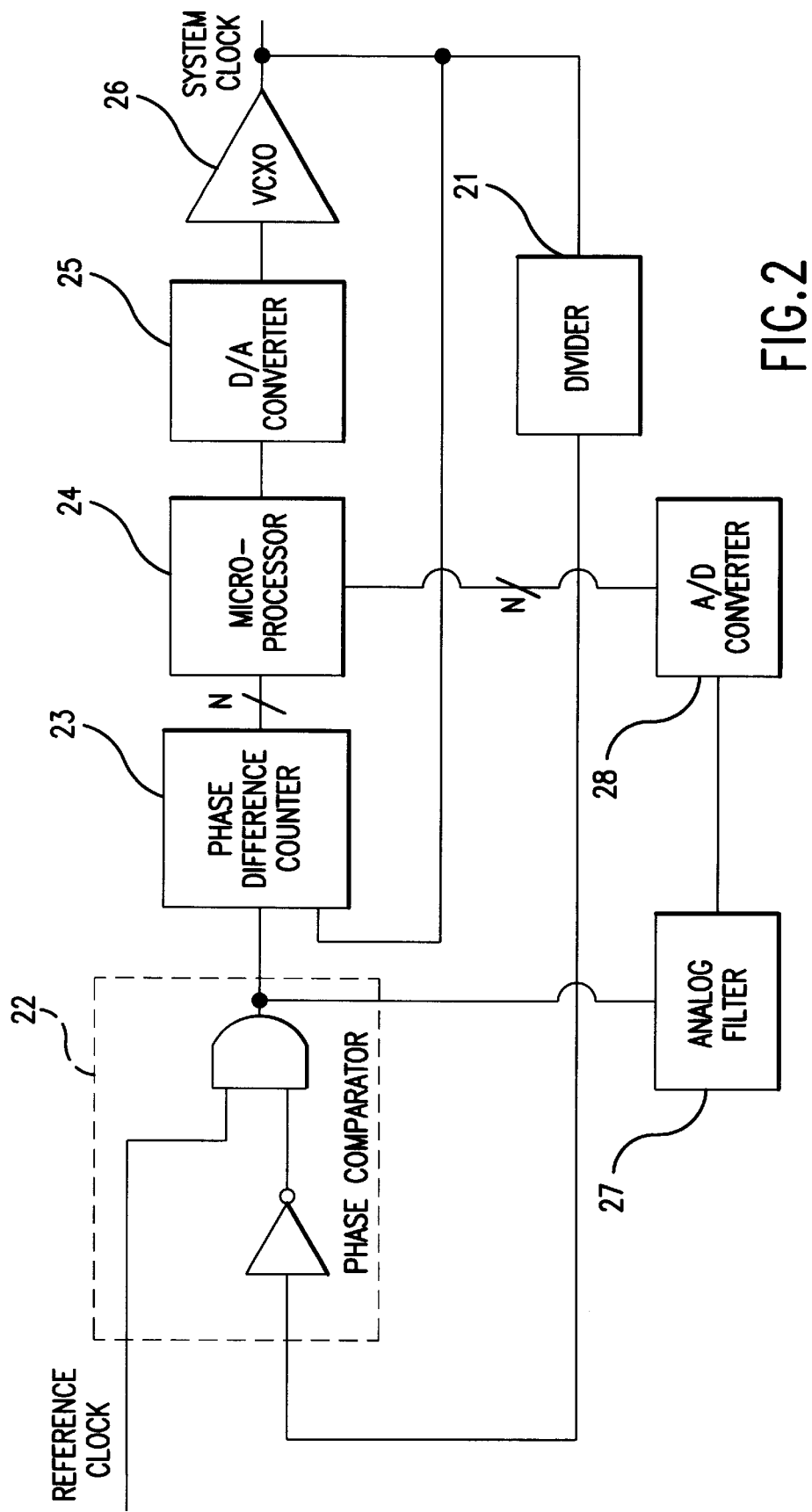

FIG. 2 shows a block diagram of a phase compensation circuit of a DPPLL according to the first embodiment of the present invention. It is comprised of a divider 21, a phase comparator 22, a phase difference counter 23, a microprocessor 24, a D/A converter 25, a VCXO 26, an analog filter 27, and an A/D converter 28 for filtering a phase difference pulse according to amplitude, respectively after comparing phases of system clock and reference clock, averaging the phase difference, making an oscillating control voltage with the average, and outputting frequency and the phase compensated system clock.

Figure 3:
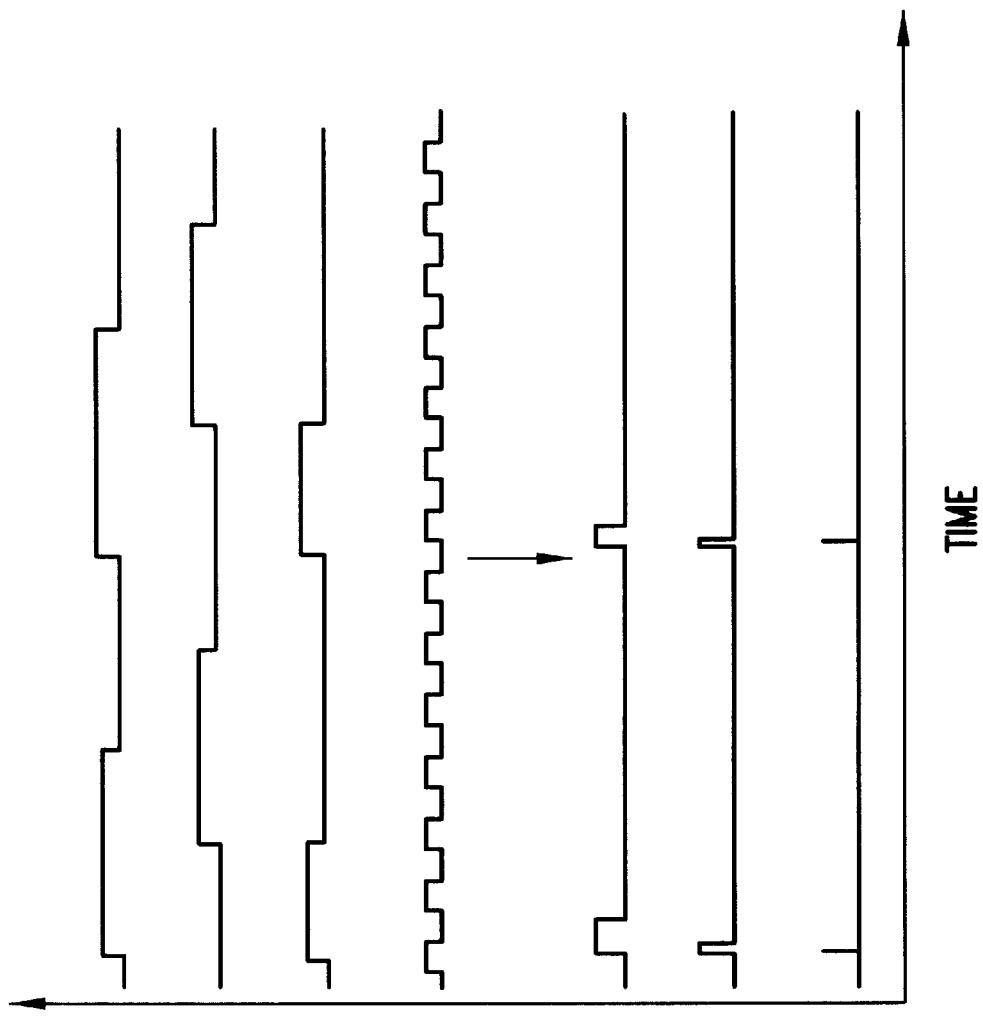

FIG. 3 shows an operational time diagram indicating a change of the phase difference referring to the FIG. 2.

Figure 1:
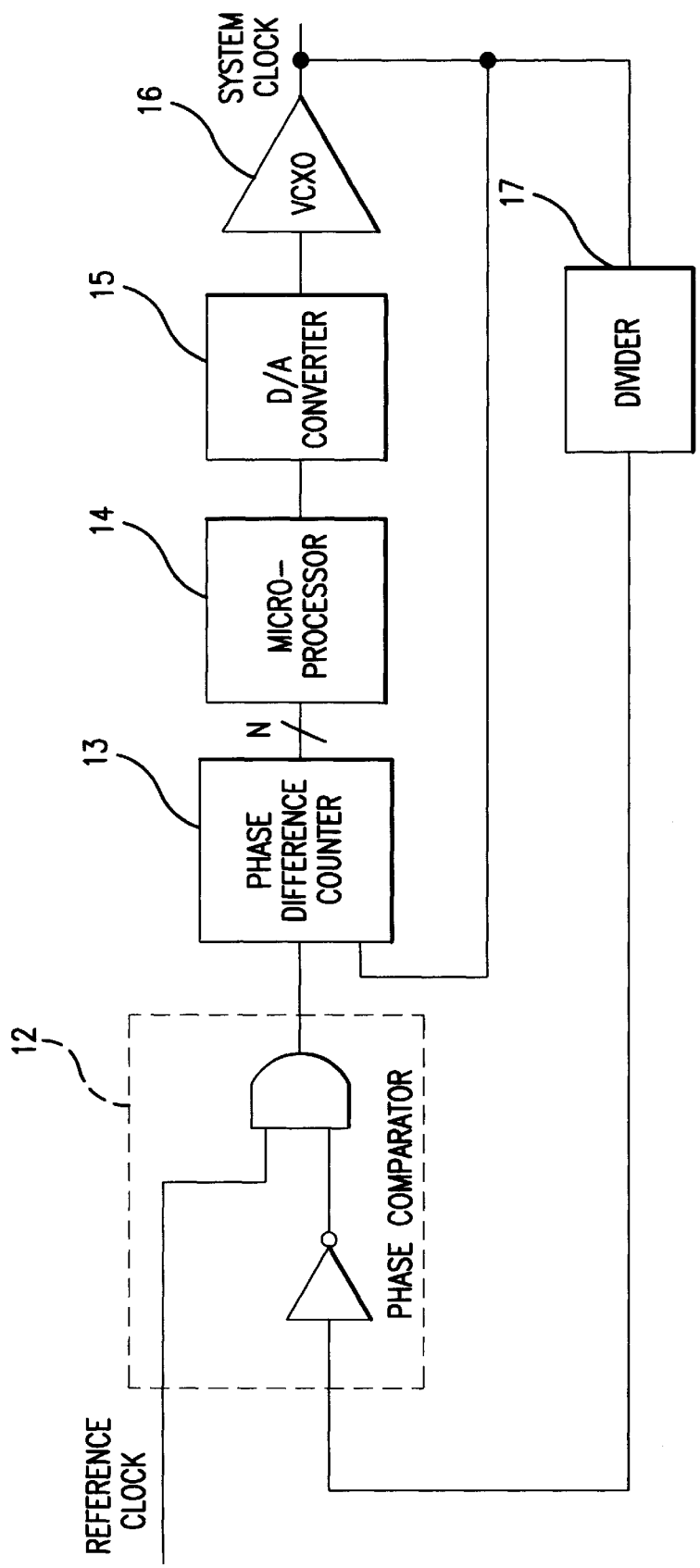

The divider 21, phase comparator 22, differential phase counter 23, D/A convertor 25, and the VCXO 26 are identified by the same structure of FIG. 1, and will not be described.

The analog filter 27 changes the phase difference pulse width applied from the comparator 22 to an analog amplitude value, and applies the corresponding converted analog amplitude value to the A/D converter 28.

The A/D converter 28 converts the analog amplitude value to a corresponding digital value and applies the digital value to the microprocessor 24.

And the microprocessor 24 selects one among the phase difference count values from the counter 22 or the digital values from the A/D convertor 28 according to an internal logic of the microprocessor 24 and averages the selected value, and then applies the corresponding average value to the D/A convertor 25. Here, the microprocessor 24 selects the differential count value when the phase difference count value is over 1 in the counter 23 and the digital value from the A/D convertor 28 when the phase difference count value is 0 in the counter 23, and then filters the selected value. It is possible to do by designing as duplicating a filter structure coefficient during programming of the microprocessor.

Now an operation according to one embodiment of the present invention will be explained.

First, referring to FIG. 3 indicating the phase difference change, the divider 21 divides the system clock generated from the VCXO 26, by a predetermined dividing rate and applies to the phase comparator 22 in order to compare the phases of the reference clock and the system clock in the DPPLL operation.

And then the phase comparator 22 inverts the clock signal from the divider 21 through an inverter and applies the inverted clock signal to the AND gate and the AND gate and-operates the inverted system clock(shown in FIG. 3b) and the reference clock(shown in FIG. 3a) and outputs the phase difference pulse(shown in FIG. 3c) after comparing the two clock phases.

Accordingly, the phase difference counter 23 counts the differential phase pulse by use of an express system clock (shown in FIG. 3d) oscillated from the VCXO 26 in order to sense the phase pulse difference width applied from the comparator 22, and outputs the count value. Here, the phase difference counter 23 applies the count value having "n" bits according to the design structure of the clock system to the microprocessor(digital filter) 24 in the DPPLL.

Additionally, the analog filter 27 changes the phase difference pulse width from the comparator 22 to an analog amplitude value, and converts the corresponding analog amplitude value to a digital value through the A/D converter 28 and applies the digital values to the microprocessor 24.

However, the microprocessor 24 sets the internal logic in order to receive the digital count value of the counter 23 as an input when the phase difference count value is over 1. So, the count value having "n" bits from the counter 23 is filtering like a formula 1 below in the microprocessor 24.

$$A=\Sigma C(M)/M \qquad \text{formula 1.}$$

Here, the "M" indicates number of times that the count value having the "n" bits from the differential counter 23 is applied, and "C(M)" is the count value having the "n" bits applied at the "M" th, "Σ C(M)" indicates a sum of the count values having the "n" bits applied during the "M" times successively, and the "A" is an average of the count values having the "n" bits applied during the "M" times successively.

The average value(A) calculated from the microprocessor 24 is outputted to the D/A converter 25, the D/A converter 25 converts the average value(A) to a corresponding analog amplitude value, and controls an oscillating voltage of the VCXO 26 by applying the corresponding converted analog amplitude value to the VCXO 26.

Then, the VCXO 26 oscillates and outputs the system clock of frequency in accordance with the analog amplitude value from the D/A converter 25.

And the system clock outputted form the VCXO 26 is applied to the divider 21 and the divider 21 divide the system clock by a predetermined dividing rate for comparing the phase difference with the reference clock. And the above operation is repeated, successively.

During the above operation is repeated, the system clock follows the reference clock, successively and the differential phase difference(shown in FIG. 3e)(second difference pulse) with the reference clock becomes smaller to less than one cycle of the system clock and the count value having "n" bits outputted from the counter 23 finally becomes to 0. Accordingly, the phase difference counter 23 may not carry out counting the differential pulse amplitude any more.

But, the microprocessor 24 is already designed for capable of switching about two inputs(digital count value and analog amplitude value) when the count value of the counter 23 is less then 1 (when the differential pulse width from the comparator is changed to less than one cycle of the system clock).

Accordingly, when the count value of the counter 23 is less than 0, the internal switching operation is accomplished in the microprocessor 24, and the second phase difference pulse inputted through the analog filter 27 and A/D converter 28, is applied to the microprocessor 24.

So, the digital value applied from the A/D converter 28 is filtering like below formula 2 in the microprocessor 24.

$$A'=\Sigma C(M')/n' \qquad \text{formula 2}$$

Here, n' is number of times that the phase difference count value is less than 1, C(M')' indicates a corresponding digital value in case that the phase difference count value is less than 1, and A' indicates a phase difference average value in case that the differential phase difference count value is less than 1.

The D/A converter 25 converts the average value(A') to the analog amplitude value and applies the analog amplitude value to the VCXO 26. And the VCXO 26 oscillates the system clock of the frequency in accordance with the analog amplitude value applied from the D/A converter 25, and outputs the system clock.

Like this way, an absolute phase difference between the system clock oscillated from the VCXO 26 and the reference input value, becomes smaller. And the phase difference width becomes 0 gradually like a third phase difference pulse(FIG. 3f) or a fourth phase difference pulse(FIG. 3g) when the above operation, in which the system clock oscillated from the VCXO 26 is applied to the divider 21 and divided, is successively repeated.

Besides, in case of abnormal situation, such as, frequency change of the reference clock or a phase shift happen suddenly, the differential phase pulse width becomes larger and the digital count value of the phase difference counter 23 is over 1. Here, the "C(M)" value may be an outputting value from the counter 23 or the A/D converter 28 during the "M" times.

In other words, in case that the count value having n bits outputted from the counter 23 is 0, the outputted value from the A/D converter 28 is the "C(M)". And in case that the count value having "n" bits outputted from the counter 23 is over 1, the outputted value from the phase difference counter 23 is the "C(M)".

Here in the counter value having n bits, the "n" may be different according to a design structure and clock frequency according to the corresponding system, and the "M" and circle for controlling the VCXO 26, are acquired by theoretical calculation and repeated test with considering the system clock frequency, capacity of the microprocessor 24, the converting steps of the D/A converter 25, and etc.

Finally, the phases of the system clock and the reference clock are almost matched each other after the DPPLL is locked to the reference clock, the system clock phase supplied from each clock unit, are therefore automatically matched because the reference clock and the phase are matched even though each unit separately carries out the PLL operation in the one by one switching structure using the pair of clock units. Even though the system switching is accomplished in above case, there is no effect to service of the system according to the corresponding switching.

Figure 4:
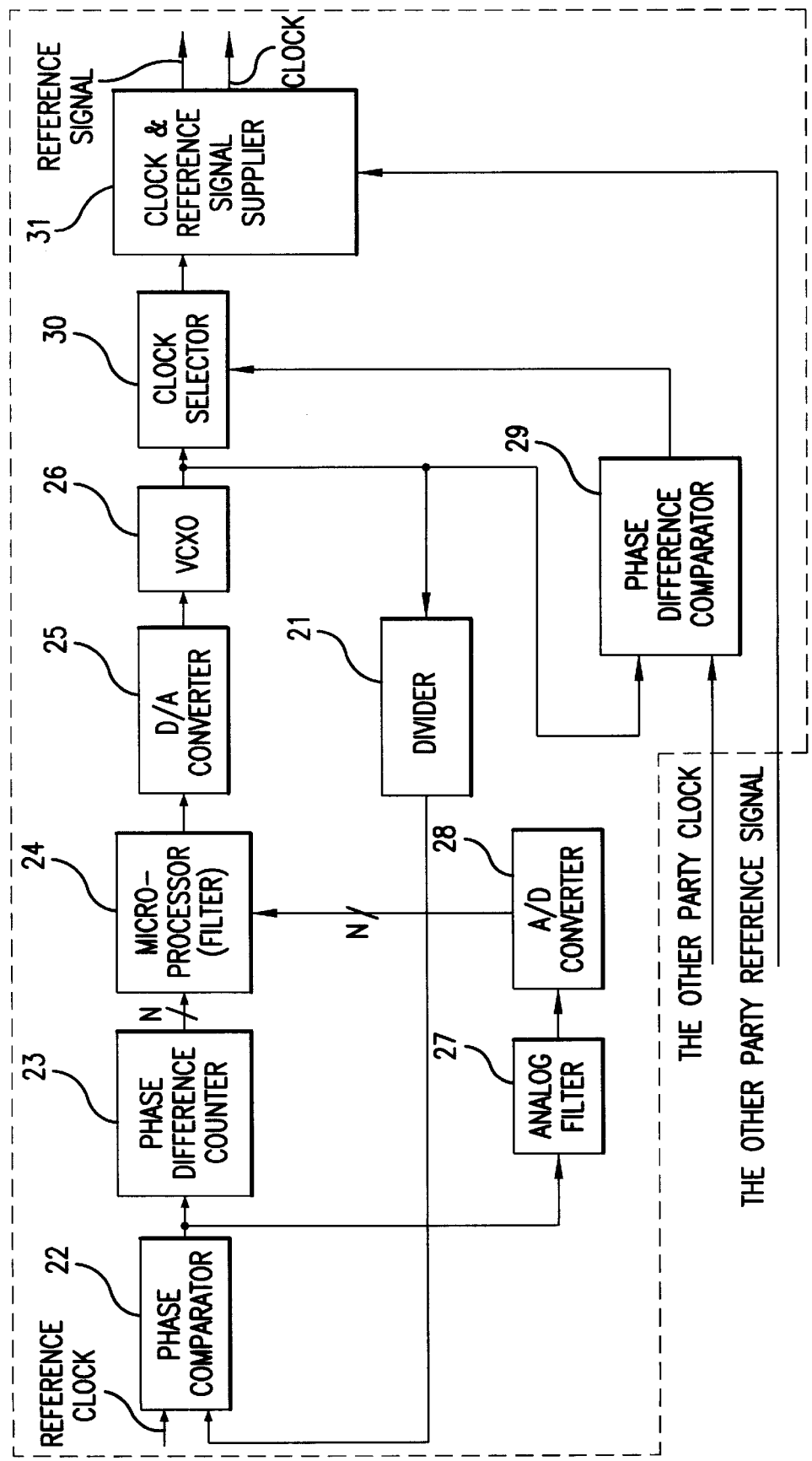

FIG. 4 is a block diagram indicating a phase compensation circuit of a DPPLL for hitless switching in duplicated clock suppling system by using the pair of clock units according to a second embodiment of the present invention. Referring to FIG. 4, one clock unit is only indicated.

In accordance with the other embodiment of the present invention, it is further comprises a phase difference (comparator 29, a clock selector 30, and a clock and reference signal supplier 31 in the DPPLL of FIG. 2 in order that a clock unit compares own clock with phase by commonly having the other party (lock and switching the system clock in an area where the phase differences is small.

Here, it is preferred that the phase difference comparator 29 compares two clock phases by receiving the own clock and the other party clock as an input, detects an area where the phase difference is the shortest after comparing, and then generates an output(clock select signal).

The (clock selector 30 selects the own clock or the other party clock according to the clock select signal and applies the own clock or the other party clock to the clock and reference signal supplier 31. And the supplier 31 supplies the reference signal and the clock by outputting the own clock in case of main unit and supplies the reference signal and the clock by outputting the other party clock in case of reserved unit according to the clock applied from the clock selector 30. The phases of two clocks and reference signal are always same in a unit which receives the clock and reference signal. The reason is that the main unit and the reserved unit are operated using one's DPPLL but the outputting clock is the one of the main unit. In other words, source of the output clock of the pair of units is one.

Figure 5:
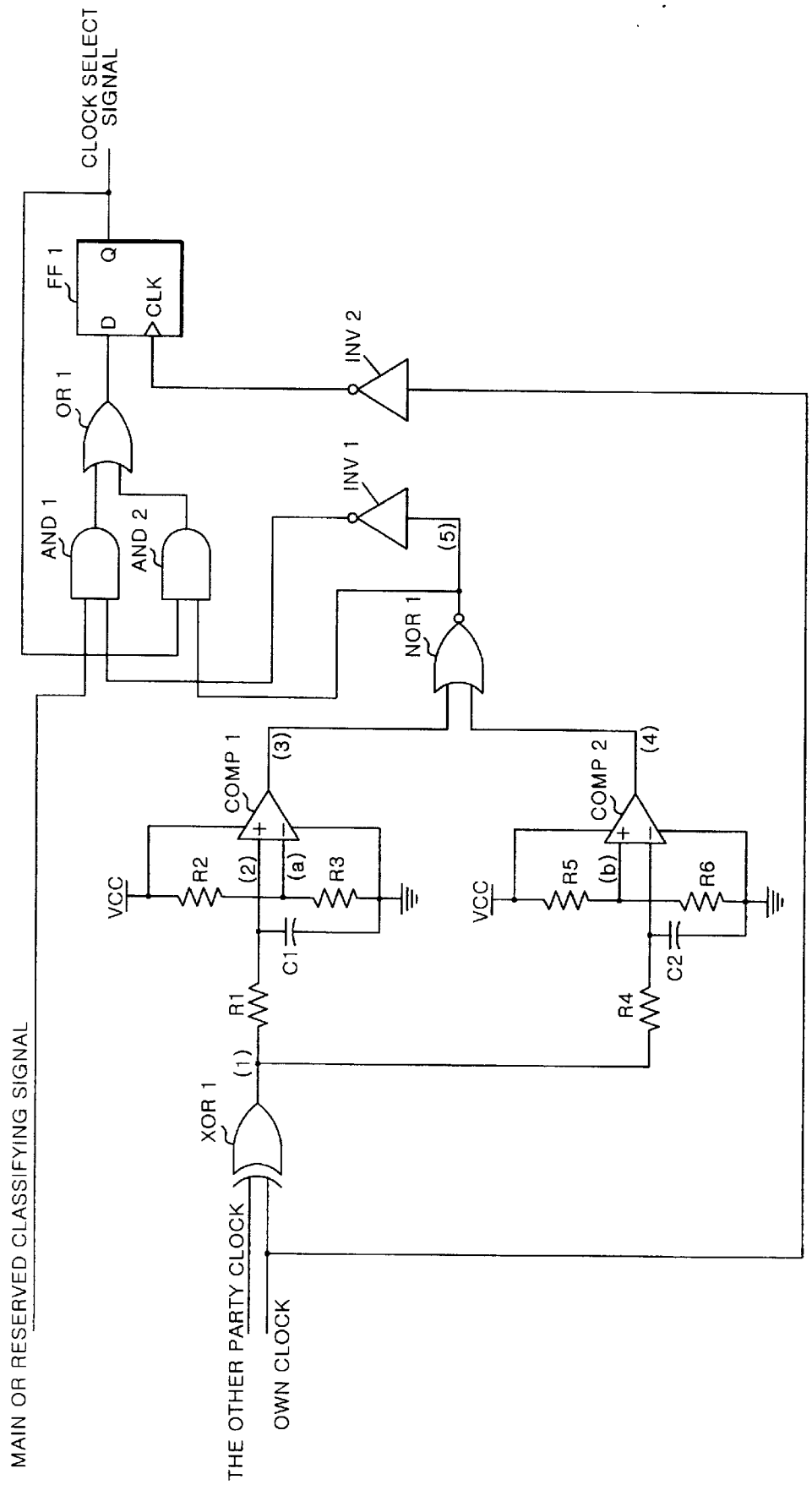

FIG. 5 shows in detail a circuit diagram of a phase difference comparator. A phase difference of own clock and other party clock are outputted as a pulse((1) wave of FIG. 6) through an exclusive OR gate. The pulse of the phase difference is converted to a corresponding direct current (DC) level((2) wave of FIG. 6) through a plurality of registers and capacitors. The DC level is compared with an upper reference value(a) by using a first voltage comparator (COMP 1) and with a lower reference value(b) by using a second voltage comparator(COMP2). In case that the DC level is higher than the upper reference value or lover than the lower reference value, logic high is outputted((3), (4) waves of FIG. 6) through the two voltage comparators.

Here, the registers and capacitors for converting the phase difference to the DC level should be adjusted according to a corresponding clock frequency.

Figure 6:
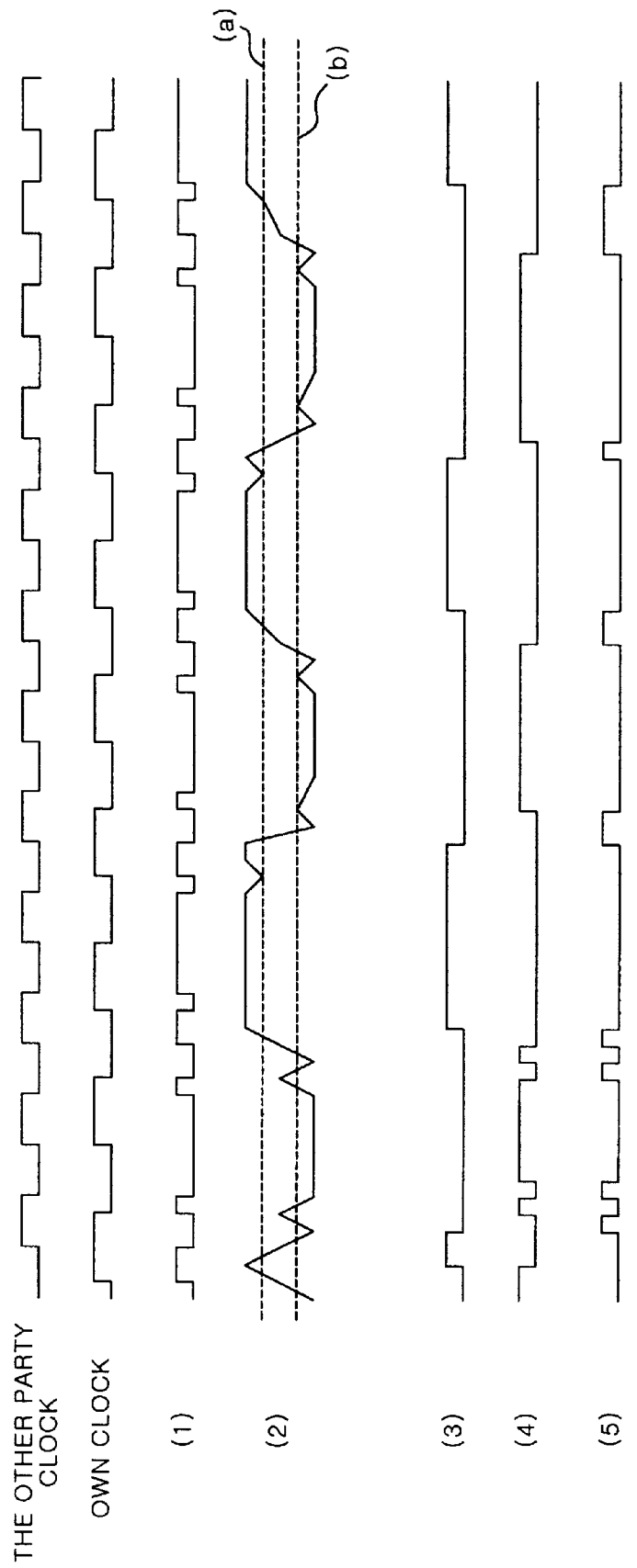

Two pulses outputted from the comparators(COMP1, 2) are through a NOR gate(NOR1) and an output of the NOR1((5) wave of FIG. 6) is inputted as a clock select signal of the clock selector 30 which comprises two AND gates (AND1, 2), an invertor(INV1), an OR gate(OR1) and a flipflop(FF1).

Accordingly, the clock select signal to the clock selector 30 is outputted to the trailing edge of the own clock during logic high. The reason why the clock select signal is outputted to the trailing edge of the own clock, is, that a positive edge of an unwanted clock is outputted in case of not using the FF1 at the moment when the other party clock is logic low and own clock is logic high(it is assumed that the clock supply system use the positive edge).

FIG. 6 is an operational timing flowchart of each part of the FIG. 5.

A clock select signal outputted from the other embodiment of the present invention may be outputted in case that clock phases have a phase difference which does not affect a system.

In other words, a clock from the clock selector 30 is outputted as own clock and inputted to the clock and reference signal supplier 31. And the supplier 31 outputs own reference clock in case of main unit and the other party reference clock in case of reserved unit according to states of main or reserved unit. Consequently, the clock as well as the reference signal which are absolutely matched in the pair of units, are outputted.

Here, it might do not need to switch by comparing the phase difference of each other with clock referring to FIG. 4 because the present invention always matches the phases in case of matching the absolute phase shown in FIG. 2. But there are situations that the reference clock of the SDH N/W includes own jitter in the system because the reference clock is inputted to the system through several steps, oscillates in a hold-over mode by the reference clock missing and is in a free-running state by user's choice. Therefore, it may prevent sudden problems in the system by switching according to the phase difference after comparing the clocks of each other in any situation.

According to the present invention, by matching an absolute phase to the reference clock in case of receiving a proper reference clock, it is capable of switching without any effect to the system during switching between the pair of clock units. Additionally, if the reference clock has problems or the clock is cutting, output of the pair of clock units are not matching, successively. Therefore, it is capable of hitless switching by switching in case that the phase is synchronized.

The present invention is not limited to the specifically disclosed embodiments, and variations and modifications may be made without departing from the scope of the present invention.

What is claimed is:

1. A digital processing phase-locked loop (DPPLL), comprising:

a first detecting path converting a value of a phase difference pulse outputted from a phase comparator into a digital first phase difference value, a second detecting path converting the value of the phase difference pulse into an analog value and producing a second phase difference value, control means for comparing the digital first phase difference value with a system clock value and selecting and outputting the second phase difference value in a case that the digital first phase difference value is smaller than a specific range of the system clock value, and voltage controlled oscillating means for outputting a phase compensated system clock by using the phase difference value outputted from the control means.

2. The DPPLL according to claim 1, wherein the specific range of the system clock value is less than one cycle.

3. The DPPLL according to claim 1, wherein the first detecting path comprises a phase difference counter for counting the phase difference pulse outputted from the phase comparator, with the system clock, converting the value of the phase difference pulse into a digital value and outputting the digital first phase difference value.

4. The DPPLL according to claim 1, wherein the second detecting path comprises:

an analog filter for detecting the phase difference pulse outputted from the phase comparator and providing the analog value, and an A/D converter for converting the analog value into the second phase difference value.

5. A digital processing phase-locked loop (DPPLL), comprising:

a first detecting path converting a value of a phase difference pulse outputted from a phase comparator into a digital first phase difference value, a second detecting path converting the value of the phase difference pulse into an analog value and producing a second phase difference value, control means for comparing the digital first phase difference value with a system clock value and selecting and outputting the second phase difference value in a case that the digital first phase difference value is smaller than a specific range of the system clock value, voltage controlled oscillating means for outputting a phase compensated system clock by using the phase difference value outputted from the control means, and phase switching means for switching a system clock by comparing a phase of the phase compensated system clock with a phase of a second phase compensated system clock and detecting an area where a phase difference is smallest.

6. The DPPLL according to claim 5, wherein the specific range of the system clock value is less than one cycle.

7. The DPPLL according to claims 5, wherein the first detecting path comprises a phase difference counter for counting the phase difference pulse outputted from the phase comparator, with the system clock, converting the value of the phase difference pulse into a digital value and outputting the digital first phase difference value.

8. The DPPLL according to claim 5, wherein the second detecting path comprises:
   an analog filter for detecting the phase difference pulse outputted from the phase comparator and providing the analog value, and
   an A/D converter for converting the analog value into the second phase difference value.

9. The DPPLL according to claim 5, wherein the phase switching means comprises a phase difference comparator.

10. The DPPLL according to claim 9, wherein the phase switching means comprises clock select means for selecting one of the phase compensated system clocks according to a clock selectsignal applied from the phase difference comparator.

11. The DPPLL according to claim 10, wherein the phase switching means comprises clock and reference signal supplying means for supplying the system clock and reference signal in accordance with an output signal of the clock select means.

* * * * *